US008133772B2

(12) United States Patent
Barth, Jr. et al.

(10) Patent No.: US 8,133,772 B2
(45) Date of Patent: Mar. 13, 2012

(54) DEEP TRENCH CAPACITOR FOR SOI CMOS DEVICES FOR SOFT ERROR IMMUNITY

(75) Inventors: John E. Barth, Jr., Williston, VT (US); Kerry Bernstein, Underhill, VT (US); Ethan H. Cannon, Essex Junction, VT (US); Francis R. White, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/075,271

(22) Filed: Mar. 30, 2011

(65) Prior Publication Data

US 2011/0177660 A1    Jul. 21, 2011

Related U.S. Application Data

(62) Division of application No. 12/200,538, filed on Aug. 28, 2008, now Pat. No. 7,989,865.

(51) Int. Cl.
    *H01L 21/8242* (2006.01)
(52) U.S. Cl. ................. 438/155; 257/301; 257/E21.646
(58) Field of Classification Search .................. 438/155; 257/301
    See application file for complete search history.

(56) References Cited

U.S. PATENT DOCUMENTS

| | | | |
|---|---|---|---|
| 4,873,560 A | 10/1989 | Sunami et al. | |
| 6,399,435 B1 | 6/2002 | Tihanyi | |
| 6,696,717 B2 | 2/2004 | Chang et al. | |
| 7,276,753 B2 | 10/2007 | Wu | |
| 7,332,392 B2 | 2/2008 | Lin et al. | |
| 7,361,933 B2 | 4/2008 | Kawabata et al. | |
| 2003/0134468 A1 | 7/2003 | Wang et al. | |
| 2004/0000690 A1 | 1/2004 | Kujirai et al. | |
| 2009/0026516 A1 | 1/2009 | Cheng et al. | |

OTHER PUBLICATIONS

Wu, B. "Pillar Dram Cell With Dual Channels and an Underneath Trench-in-Trench Capacitor Built on Soi Structure", IBM Technical Disclosure Bulletin, Nov. 1993, pp. 141-144.

*Primary Examiner* — Jarrett Stark
*Assistant Examiner* — Lawrence Tynes, Jr.
(74) *Attorney, Agent, or Firm* — Cantor Colburn LLP; Vazken Alexanian

(57) ABSTRACT

A semiconductor structure is disclosed. The semiconductor structure includes an active semiconductor layer, a semiconductor device having a gate disposed on top of the active semiconductor layer, and source and drain regions and a body/channel region disposed within the active semiconductor layer, an insulator layer having a first and second side, the first side being adjacent to the active semiconductor layer, a substrate disposed adjacent to the second side of the insulator layer, a deep trench capacitor disposed under the body/channel region of the semiconductor device. The deep trench capacitor electrically connects with and contacts the body/channel region of the semiconductor device, and is located adjacent to the gate of the semiconductor device. The semiconductor structure increases a critical charge Qcrit, thereby reducing a soft error rate (SER) of the semiconductor device.

7 Claims, 5 Drawing Sheets

DEEP TRENCH CAPACITOR FOR SOI CMOS DEVICES FOR SOFT ERROR IMMUNITY

CROSS-REFERENCE TO RELATED APPLICATIONS

This is a divisional of U.S. patent application Ser. No. 12/200,538, filed Aug. 28, 2008, the disclosure of which is incorporated by reference herein in its entirety.

BACKGROUND

The present invention relates to complimentary metal oxide semiconductor (CMOS) structures, and more specifically, to a semiconductor structure that incorporates a capacitor within the structure for reducing the soft error rate (SER) of a circuit.

Soft errors are a problem for bistables such as latches and cross-coupled sense amplifiers in memory devices, for example. These errors occur due to noise, for example, which causes information to be loss without damage to the circuit. Existing methods for mitigating soft errors tend to add area and delay arising from the addition of devices or capacitance added to harden the circuit. The minimum charge required to cause a soft error is known as a critical charge, Qcrit. As Qcrit decreases, the SER increases and vice versa. The additional devices and capacitance increase Qcrit, however at substantial manufacturing costs.

SUMMARY

According to one embodiment of the present invention, a semiconductor structure is disclosed. The semiconductor structure includes an active semiconductor layer, a semiconductor device having a gate disposed on top of the active semiconductor layer, and source and drain regions and a body/channel region disposed within the active semiconductor layer, an insulator layer having a first and second side, the first side being adjacent to the active semiconductor layer, a substrate disposed adjacent to the second side of the insulator layer, a deep trench capacitor disposed under the body/channel region of the semiconductor device. The deep trench capacitor electrically connects with and contacts the body/channel region of the semiconductor device, and is located adjacent to the gate of the semiconductor device.

In another embodiment, a semiconductor structure which includes an active semiconductor layer, an insulator layer having a first and second side, the first side being adjacent to the active semiconductor layer, a substrate disposed adjacent to the second side of the insulator layer, a plurality of semiconductor devices, each semiconductor device including a gate disposed on top of the active semiconductor layer, and source and drain regions and a body/channel region disposed within the active semiconductor layer, and a deep trench capacitor disposed under the body/channel regions of the semiconductor devices. The deep trench capacitor electrically connects with and contacts the body/channel regions.

In yet another embodiment, a semiconductor structure includes an active semiconductor layer, an insulator layer having a first and second side, the first side being adjacent to the active semiconductor layer, a substrate disposed adjacent to the second side of the insulator layer, a plurality of semiconductor devices, each semiconductor device including source and drain regions and a body/channel region disposed within the active semiconductor layer, and sharing a common gate disposed on top of the active semiconductor layer, and a deep trench capacitor disposed under the body/channel regions of the semiconductor devices. The deep trench capacitor electrically connects with and contacts the body/channel regions.

In yet another embodiment, a method of forming semiconductor structure includes forming a substrate, forming an insulating layer on top of the substrate, forming an active semiconductor layer on top of the insulating layer, forming a semiconductor device having a gate on top of the active semiconductor layer, and source and drain regions and a body/channel region within the active semiconductor layer, and forming a deep trench capacitor beneath the body/channel region of the semiconductor device, and electrically connecting and contacting the deep trench capacitor with the body/channel region of the semiconductor device.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1A:
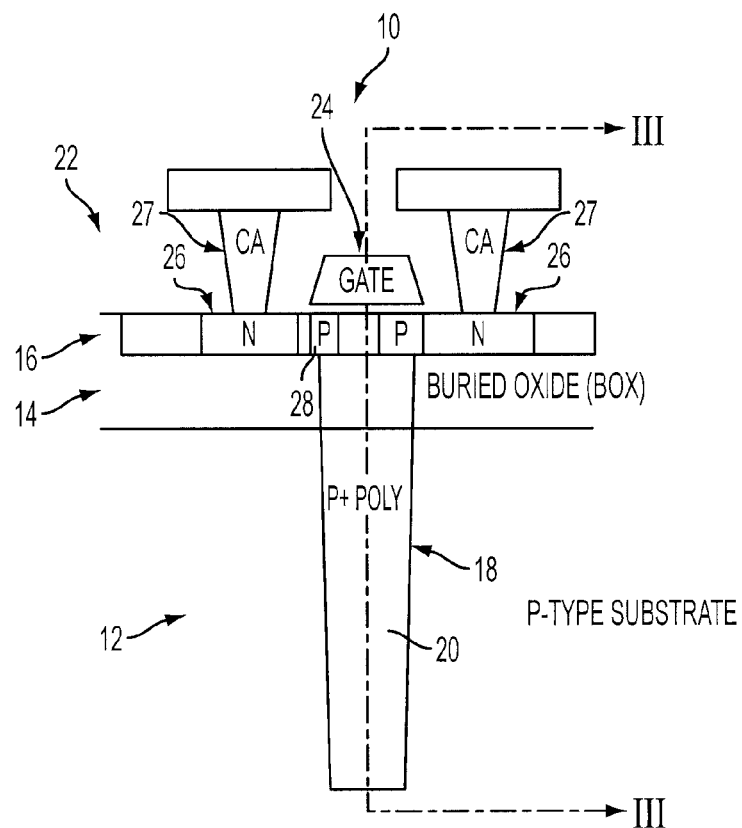
FIGS. 1A and 1B are a cross-sectional view and a lateral view illustrating a semiconductor structure that can be implemented within embodiments of the present invention.
Figure 1B:
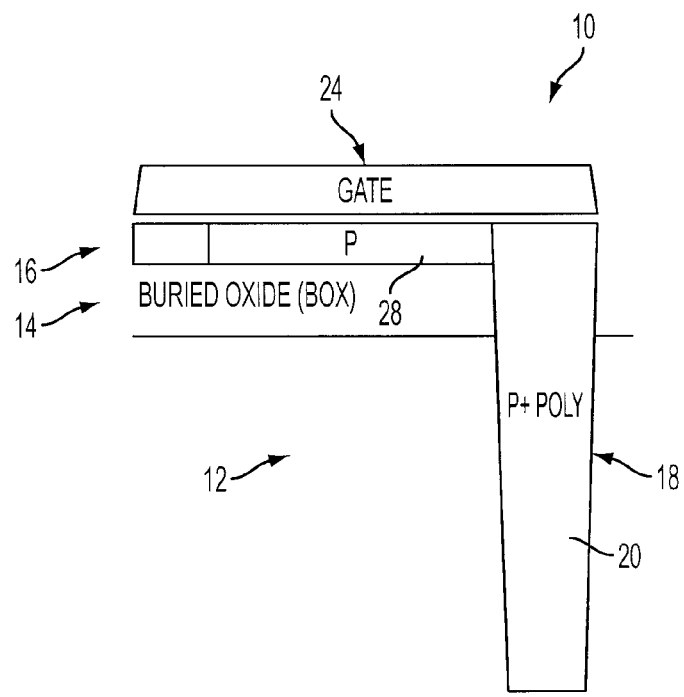

With reference now to FIGS. 1A and 1B, the present invention incorporates capacitor-based dynamic random access memory (eDRAM) technology into high performance semiconductor structures. As shown in FIGS. 1A and 1B, according to an embodiment, a multi-layer semiconductor structure 10, e.g., a silicon-on-insulator (SOI) structure incorporating a deep trench capacitor 18 is provided in order to reduce SER of a semiconductor device within the semiconductor structure 10. As shown in FIGS. 1A and 1B, the multi-layer semiconductor structure 10 includes a silicon-based substrate 12 such as a p-type substrate which acts as a handle wafer. An insulating layer 14 (e.g., a thick buried oxide (BOX) layer) is formed on top of the p-type substrate 12 having a thickness of approximately 1000 Angstroms (Å), via a low pressure chemical vapor deposition (LPCVD) process, for example. An active semiconductor layer 16 including n-type or p-type dopants is then formed on top of the insulating layer 14. A semiconductor device 22 is formed within and on top of the active semiconductor layer 16. The semiconductor device 22 includes a gate 24, source and drain regions 26 and a body/channel region 28 intermediate to the source and drain regions 26 and directly below the gate 24.

Figure 3:
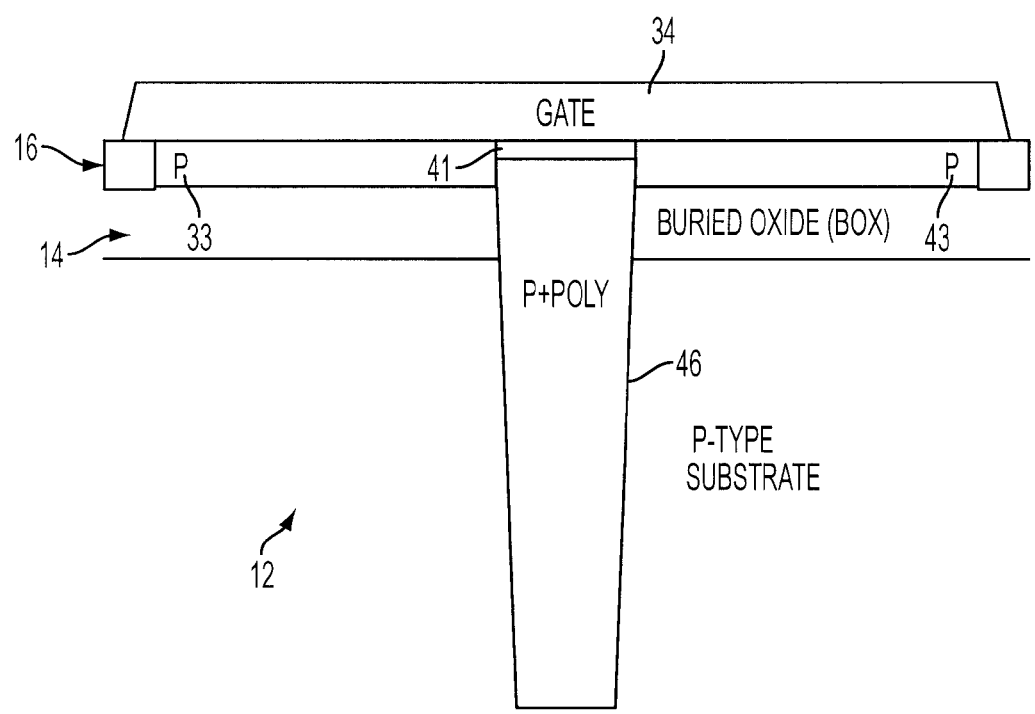
FIG. 3 is a cross-sectional view illustrating a semiconductor structure having a shared configuration between two semiconductor devices within the semiconductor structure that can be implemented within alternative embodiments of the present invention.

The deep trench capacitor 18 (hereinafter referred to as "DT capacitor") is formed by etching and drilling a trench through the active semiconductor layer 16, the insulating layer 14 and in the p-type substrate 12, prior to forming the semiconductor device 22. The trench is lined with an insulating material and a conductive material 20 is then deposited into the trench via a deposition process. The conductive material 20 may be polysilicon or any suitable conductive material for the purposes disclosed herein may be used. In one embodiment, the conductive material 20 is doped polysilicon deposited via a low temperature epitaxial process. The conductive material 20 is then recessed in the trench such that a top surface of the trench is within the insulating layer 14. A dielectric collar material (not shown) is then deposited and a dielectric collar is formed by directional etching of the dielectric collar material leaving a dielectric spacer on the sidewall of the trench. A mask (not shown) is then used to remove the dielectric collar material where contact between the DT capacitor 18 and the body/channel region 28 is desired. The mask opening is smaller than the length of the gate 24 to prevent the trench material from shorting the channel to the source/drain regions 26. Additional conductive material 20 is deposited and planarized. Optionally, according to another embodiment, the conductive material 20 may be recessed into the trench such that the conductive material 20 remains in contact with the body/channel region 28 providing a desired electrical contact between the trench and the body/channel region 28 of the semiconductor device 22, and a dielectric may be deposited and planarized in order to form an isolation region 41 (as depicted in FIG. 3, for example) to electrically isolate the trench from all regions except the buried contact described above.

Further, as shown in FIGS. 1A and 1B, the semiconductor device 22 further includes contacts 27 which align the source and drain regions 26. The DT capacitor 18 is electrically connected with and contacts the body/channel region 28, and is formed adjacent to the gate 24, to add capacitance to the body/channel region 28, which increases Qcrit and in turn reduces the SER of the semiconductor device 22. The additional capacitance reduces the net voltage change of the body/channel region 28, which enables the threshold voltage to remain stable and forces less current to be transmitted across the semiconductor device 22. According to one embodiment, the semiconductor device 22 is a NFET device that includes n+ source and drain regions 26 and a p+ body/channel region 28 beneath the gate 24. However, the present invention is not limited hereto, and any suitable device for the purpose described herein may be used.

According to one embodiment of the present invention, the DT capacitor 18 is filled with the same type of silicon (p-type or n-type) as the body/channel region 28 of the device 22 to create an ohmic connection between the body/channel region 28 and the DT capacitor 18. For example, as shown in FIGS. 1A and 1B, the body/channel region 28 and the DT capacitor 18 are filled with p+ polysilicon. Further, according to one embodiment, the DT capacitor 18 is formed adjacent to an end portion of the body/channel region 28 beneath the gate 24. Therefore, a conductive path extends from the body/channel region 28 to the end portion and to the DT capacitor 18.

Figure 2:
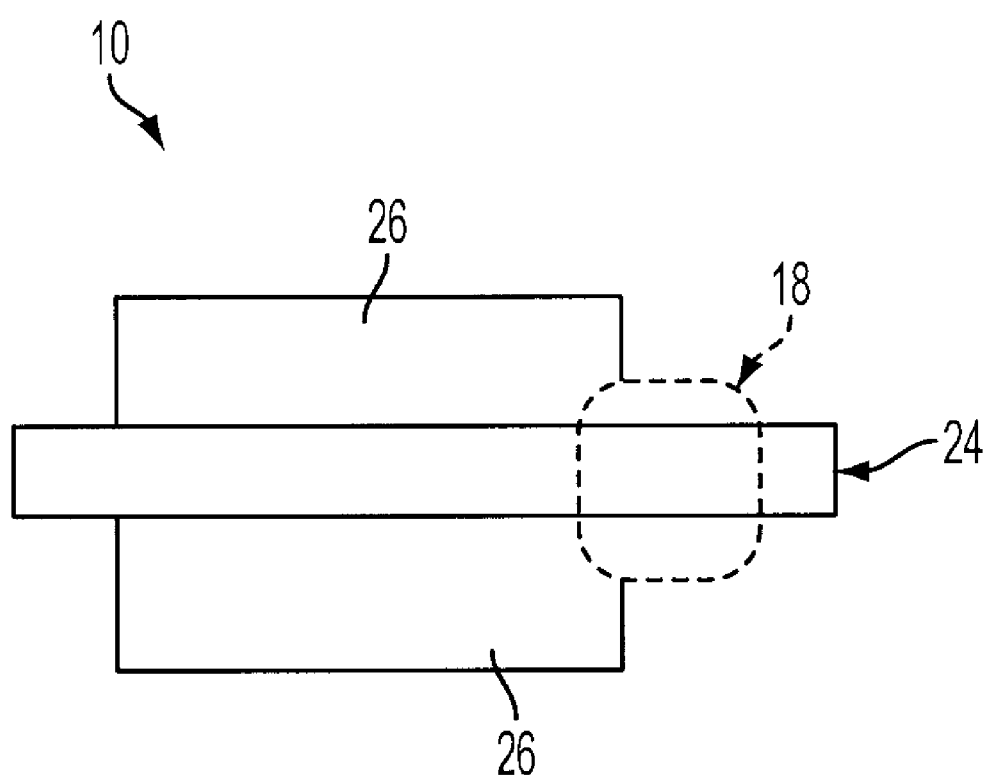
FIG. 2 is a top view illustrating the semiconductor structure as shown in FIGS. 1A and 1B.

FIG. 2 illustrates a top view of the semiconductor structure 10 as taken along the line III-III as shown in FIG. 1. FIG. 2 illustrates the gate 24, source and drain regions 26 and the DT capacitor 18. As shown in FIG. 2, a width of the DT capacitor 18 is larger than a width of the gate 24 of the semiconductor device. Further, the DT capacitor 18 is formed such that it is adjacent to an end portion of the gate 24 and contacts with the body/channel region 28 (as depicted in FIGS. 1A and 1B). The present invention is not limited to the DT capacitor 18 being formed at a particular portion of the body/channel region 28, and may vary as necessary. An alternative configuration will be described below with reference to FIGS. 5 and 6. Since the DT capacitor 18 is formed at an end portion of the body/channel region 28 as shown in FIGS. 1A and 2, the DT capacitor may be shared between multiple semiconductor devices as described below with reference to FIGS. 3 and 4, according to another embodiment of the present invention.

Figure 4:
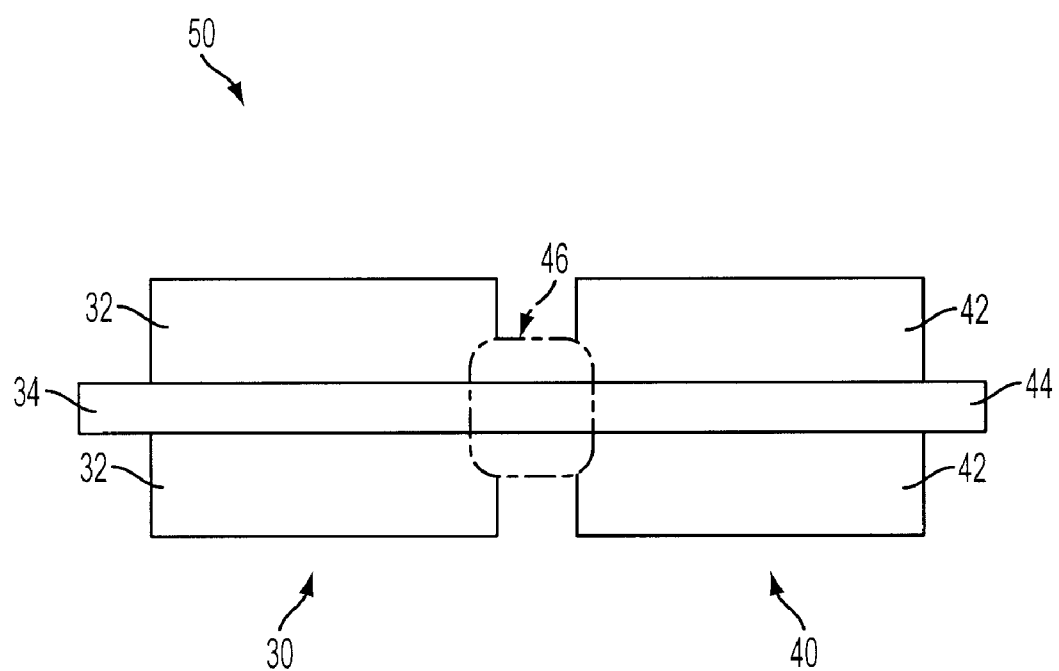
FIG. 4 is a top view illustrating the semiconductor structure as shown in FIG. 3.

FIGS. 3 and 4 respectively illustrate a cross sectional view and a top view of a semiconductor structure that can be implemented within an alternative embodiment of the present invention. As shown in FIGS. 3 and 4, a semiconductor structure 50 includes a plurality of semiconductor devices 30 and 40. The semiconductor device 30 includes the source and drain regions 32, a body/channel region 33 and the gate 34, and the semiconductor device 40 includes source and drain regions 42, a body/channel region 43 and gate 44. Alternatively, according to another embodiment, the semiconductor devices 30 and 40 share a common gate formed on top of the active semiconductor layer 16. In addition, the semiconductor structure 50 includes a shared DT capacitor 46 shared between the semiconductor devices 30 and 40, and is electrically connected to the body/channel regions 33, 43 of both the semiconductor devices 30 and 40. As shown in FIG. 3, the shared DT capacitor 46 is formed beneath adjacent end portions of the body/channel regions 33, 43 of the plurality of semiconductor devices 30 and 40, and contacts with the body/channel regions 33, 43 and electrically connects the body/channel regions 33, 43 to each other, thereby shunting them together. According to one embodiment, a width of the DT capacitor 46 is larger than a width of each gate 34 and 44 of the semiconductor devices 30 and 40.

Figure 5:
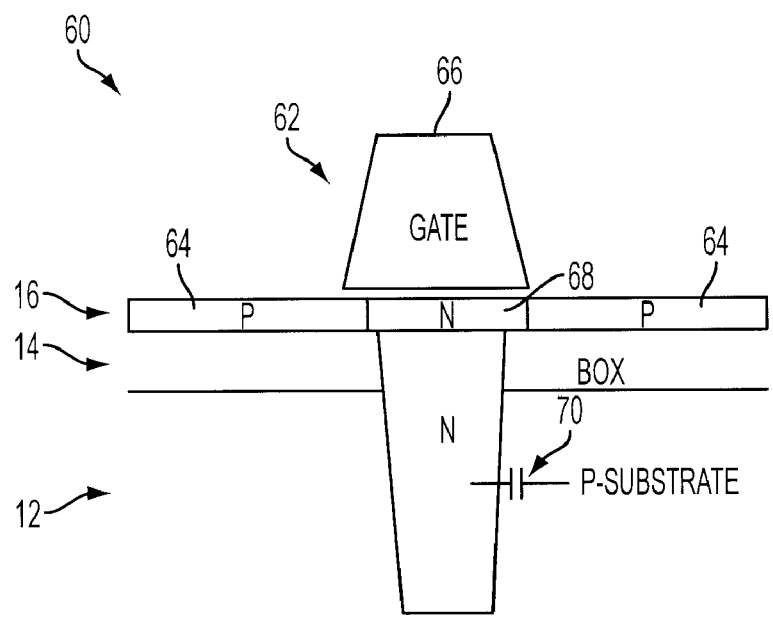
FIG. 5 is cross-sectional view illustrating a semiconductor structure that can be implemented within alternative embodiments of the present invention.
Figure 6:
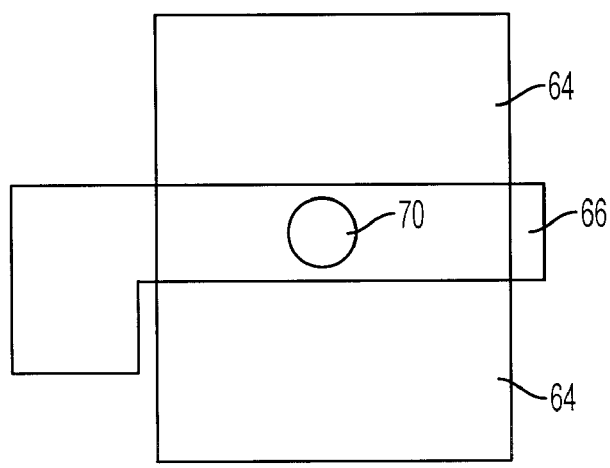
FIG. 6 is a top view of the semiconductor structure as shown in FIG. 5.

As mentioned above, FIGS. 5 and 6 illustrate a semiconductor structure that can be implemented according to alternative embodiments of the present invention. FIGS. 4 and 5 illustrate an alternative configuration of the DT capacitor according to an embodiment of the present invention. As shown in FIGS. 4 and 5, a semiconductor structure 60 according to an embodiment of the present invention, includes a PFET device 62 having p+ source and drain regions 64, a gate 66 and an n+ body/channel region 68 formed directly below the gate 66. A DT capacitor 70 is formed below a center portion of the body/channel region 68 and electrically connects with and contacts the body/channel region 68. The DT capacitor 70 is filled with n+ polysilicon i.e., the same material as that of the body/channel region 68, thereby creating a conductive path with the body/channel region 68.

Since the present invention discloses a deep trench capacitor electrically connected with and contacting a body/channel region of a SOI device to increase the capacitance in the body/channel region, the higher capacitance reduces the voltage swing of the body/channel region during a charging event, and stabilizes the threshold voltage. Thus, the present invention provides a semiconductor structure that incorporates a deep trench capacitor for reducing the SER of a device within the semiconductor structure by increasing the Qcrit, thereby minimizing manufacturing costs.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one ore more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method of forming semiconductor structure, the method comprising:
    forming an insulating layer on top of a substrate;
    forming an active semiconductor layer on top of the insulating layer;
    forming a semiconductor device having a gate on top of the active semiconductor layer, and source and drain regions and a body/channel region within the active semiconductor layer; and
    forming a deep trench capacitor beneath the body/channel region of the semiconductor device, and electrically connecting and forming an ohmic contact between the deep trench capacitor and the body/channel region of the semiconductor device.

2. The method of claim 1, wherein forming the deep trench capacitor comprises:
    etching a trench through the active semiconductor layer, the insulating layer and in the substrate; and
    filling the trench with a conductive material, wherein the conductive material is a same material as that of the body/channel region of the semiconductor device.

3. The method of claim 2, wherein forming the deep trench capacitor further comprises:
    forming the deep trench capacitor beneath an end portion of the body/channel region of the semiconductor device.

4. The method of claim 2, forming the deep trench capacitor further comprises:
    forming the deep trench capacitor beneath a center portion of the body/channel region of the semiconductor device.

5. The method of claim 2, wherein the semiconductor device is a NFET device and the deep trench capacitor and the body/channel region are filled with p+ polysilicon.

6. The method of claim 2, wherein the semiconductor device is a PFET device and the deep trench capacitor and the body/channel region are filled with n+ polysilicon.

7. The method of claim 2, wherein a width of the deep trench capacitor is larger than a width of the gate of the semiconductor device.

* * * * *